United States Patent [19]

Watanabe et al.

[11] 4,431,476
[45] Feb. 14, 1984

[54] METHOD FOR MANUFACTURING GALLIUM PHOSPHIDE SINGLE CRYSTALS

[75] Inventors: Masayuki Watanabe; Jisaburo Ushizawa; Tsuguo Fukuda, all of Yokohama, Japan

[73] Assignee: Tokyo Shibaura Denki Kabushiki Kaisha, Kawasaki, Japan

[21] Appl. No.: 336,701

[22] Filed: Jan. 4, 1982

[30] Foreign Application Priority Data

Jan. 17, 1981 [JP] Japan .................................. 56-4592
Sep. 8, 1981 [JP] Japan ............................. 56-141296

[51] Int. Cl.³ ............................................. C30B 27/02
[52] U.S. Cl. ............................. 156/607; 156/DIG. 70
[58] Field of Search .......... 156/607, 617 SP, DIG. 70

[56] References Cited

U.S. PATENT DOCUMENTS 3,647,389  3/1972  Weiner ............................... 156/607
4,196,171  4/1980  Watanabe et al. ................ 156/607
4,303,464  12/1981  Suzuki et al. ...................... 156/607

Primary Examiner—Hiram H. Bernstein
Attorney, Agent, or Firm—Oblon, Fisher, Spivak, McClelland & Maier

[57] ABSTRACT

A gallium phosphide single crystal is prepared from a polycrystalline gallium phosphide powder as a starting raw material which is obtained by hydrogen reduction of gallium phosphate and which contains residual phosphate radicals in an amount of 0.03 to 0.5% by weight. The gallium phosphide powder is compressed to prepare a green compact which is then melted to provide a gallium phosphide liquid. The gallium phosphide liquid is brought into contact with a seed crystal and is pulled.

6 Claims, 3 Drawing Figures

METHOD FOR MANUFACTURING GALLIUM PHOSPHIDE SINGLE CRYSTALS

BACKGROUND OF THE INVENTION

I. Field of the Invention

The present invention relates to a method for manufacturing gallium phosphide single crystals and, more particularly, to a method for manufacturing gallium phosphide single crystals by the pulling process.

II. Description of the Prior Art

Gallium phosphide (GaP) single crystals are widely used for manufacturing light-emitting diodes (LEDs). The GaP single crystals are conventionally manufactured by the rotary pulling process from liquid GaP. Since the melting point of GaP is as high as 1,467° C. and the decomposition pressure of GaP at this melting point is as high as about 32 atmospheres, there is conventionally adopted a method for encapsulating the GaP liquid by an encapsulating agent (liquid encapsulated Czochralski method). According to this method, the polycrystalline GaP raw material which is prepared in advance and the encapsulating agent are charged in a crucible which is arranged in a pressure-resistant vessel. The pressure-resistant vessel is pressurized by an inert gas. When the content in the crucible is heated under this condition, the encapsulating agent which has the lower melting point melts and covers the polycrystalline GaP raw material. The crucible is further heated to melt the polycrystalline GaP raw material and to provide a GaP liquid. During this procedure, the encapsulating agent liquid and the GaP liquid form separate layers due to the difference in specific gravity. The encapsulating agent liquid layer covers the GaP liquid layer and prevents the decomposition of the GaP liquid. Thereafter, through the encapsulating agent liquid layer, a seed crystal is brought into contact with the GaP liquid and is slowly pulled while being rotated. In this manner, the single crystal is grown while the GaP liquid solidifies.

As for the method for manufacturing the polycrystalline gallium phosphide raw material, a direct method is known wherein gallium and phosphorus are directly reacted in a pressure-resistant vessel. However, since this reaction is performed under high pressure and high temperature, various drawbacks are involved. The reaction apparatus becomes expensive to manufacture and complex in structure. Therefore, the manufacturing cost of this raw material becomes high. Even if gallium and phophorus of high purity such as above 99.9999% are used for manufacturing the raw material, the gallium phosphide obtained from the reaction apparatus necessarily has a low purity of less than 99.999% due to unavoidable contamination.

In order to solve this problem, a method for manufacturing polycrystalline gallium phophide by hydrogen reduction has been proposed (Japanese Patent Publication (KOKOKU) No. 13,880/79) according to which gallium phosphate is manufactured in advance and hygrogen gas is supplied to the gallium phosphate while keeping the gallium phosphate at a relatively low temperature of 1,050° C. for reaction. Efforts are being made at utilizing inexpensive polycrystalline GaP powder manufactured in this manner. However, the bulk density of the GaP powder thus obtained is as low as about 1.1 g/cc which is about ¼ the theoretical density. When the GaP powder is placed in the crucible and melted, the gas entrapped in the GaP powder forms bubbles which ascend through the encapsulating agent liquid layer. When this happens, most of GaP becomes attached to the wall surface portion of the crucible which is above the encapsulating agent liquid layer. In order to solve this problem, the GaP may be formed into a mass of high density. However, when the GaP powder is mechanically compressed, the bulk density rises to 2.0 to 3.0 g/cc at most, and this is not satisfactory either. Japanese Patent Publication (KOKAI) Nos. 129,174/75 and 129,175/75 propose a method for preparing a mass of high density of GaP powder using $B_2O_3$ as a binder. However, according to this method, when the mass is melted, $B_2O_3$ and GaP are not separated well, and the GaP powder is mixed in the $B_2O_3$ liquid layer. The GaP powder mixxed in the $B_2O_3$ decomposes when it is subjected to a high temperature during the melting procedure, contaminating the $B_2O_3$ liquid and the GaP liquid. As a consequence, monitoring of the single crystal growth interface becomes difficult. In addition to this, the contamination becomes the source of formation of polycrystalline nuclei, extremely degrading the manufacturing yield of the single crystals.

SUMMARY OF THE INVENTION

It is an object of the present invention to provide a method for manufacturing gallium phosphide single crystals at less cost and with an excellent yield.

It is another object of the present invention to provide a method for manufacturing gallium phosphide single crystals by a simple procedure utilizing the polycrystalline GaP powder which is obtained by hydrogen reduction of gallium phosphate.

According to the present invention, the starting raw material is a polycrystalline gallium phosphide powder which is obtained by hydrogen reduction of gallium phosphate and which contains residual phosphate radicals in an amount of 0.03 to 0.5% by weight. This starting material is compressed to provide a green compact which is melted into the GaP liquid. A seed crystal is brought into contact with this GaP liquid and the seed crystal is pulled to manufacture the gallium phosphide single crystal.

When the hydrogen-reduced gallium phosphide powder containing a predetermined amount of phosphoric acid radicals is used as the starting material according to the present invention, the problem of attachment of the GaP liquid to the wall surface of the crucible during melting does not occur. Furthermore, the GaP powder need not be formed into a mass using a binder. The GaP powder can be placed in the crucible separately from the encapsulating agent. Therefore, the problem of mixing of the raw material in the encapsulating agent and the resultant contamination of the surface of the encapsulating agent liquid and the gallium phosphide liquid by the GaP powder are prevented. According to the method of the present invention, GaP single crystals of excellent quality may be manufactured at less cost and with an excellent manufacturing yield.

DETAILED DESCRIPTION OF THE PREFERRED EMBODIMENTS

As has been described hereinabove, the starting raw material of the present invention is a polycrystalline gallium phosphide powder which is obtained by hydrogen reduction of gallium phosphate and which contains 0.03 to 0.5% by weight of phosphate radicals. The gallium phosphide powder which contains the phosphate radicals within the range of the amount described above may be obtained by terminating the hydrogen reduction of gallium phosphate before it is completed. The measurement of the amount of the residual phosphate radicals may be performed by the molybdenum blue absorptiometric method.

Figure 1:
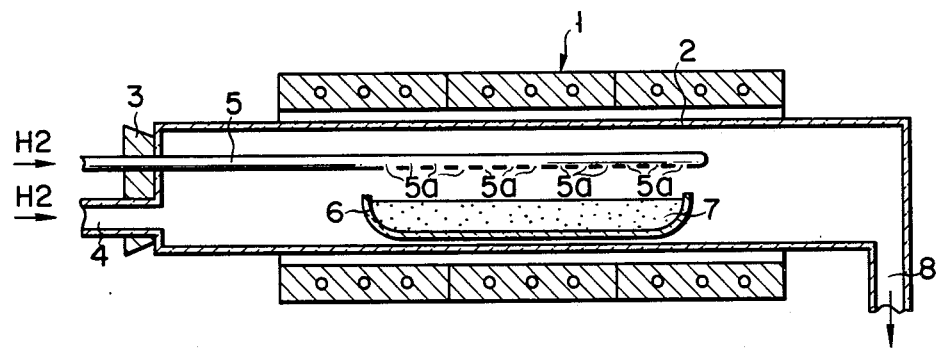
FIG. 1 is a sectional view showing a reducing apparatus for obtaining gallium phosphide.

The hydrogen reduction of gallium phosphate may be performed by, for example, an apparatus as shown in FIG. 1 according to the method described in Japanese Patent Publication (KOKOKU) No. 13,880/79. The apparatus shown in FIG. 1 has a furnace 1 in which is arranged a reaction tube 2. A heat-resistant stop 3 closes one end of the reaction tube 2. Through the stop 3 extend a main supply tube 4 for introducing hydrogen gas and an auxiliary supply tube 5 made of quartz which extends to the central portion of the reaction tube 2. A plurality of holes 5a are formed through the lower surface of the auxiliary tube 5 along the longitudinal direction thereof to provide a hydrogen gas shower in order to facilitate the reaction between hydrogen and gallium phosphate 7 placed in a boat 6. The hydrogen gas introduced into the reaction tube 2 through the main supply tube 4 and the hydrogen gas introduced through the auxiliary supply tube 5 are mixed together above the gallium phosphate 7 in the boat 6 and contacted to react with the gallium phosphate. The hydrogen gas and gallium phosphide are reacted at a temperature of 750° to 1,050° C. The unreacted hydrogen gas serves as a carrier for the reaction products except the gallium phosphide, such as hydrogen phosphide and $H_2O$ vapor and is exhausted through an outlet port 8. The flow rate of the hydrogen gas is 1,500 to 3,000 l/h.

Figure 2:
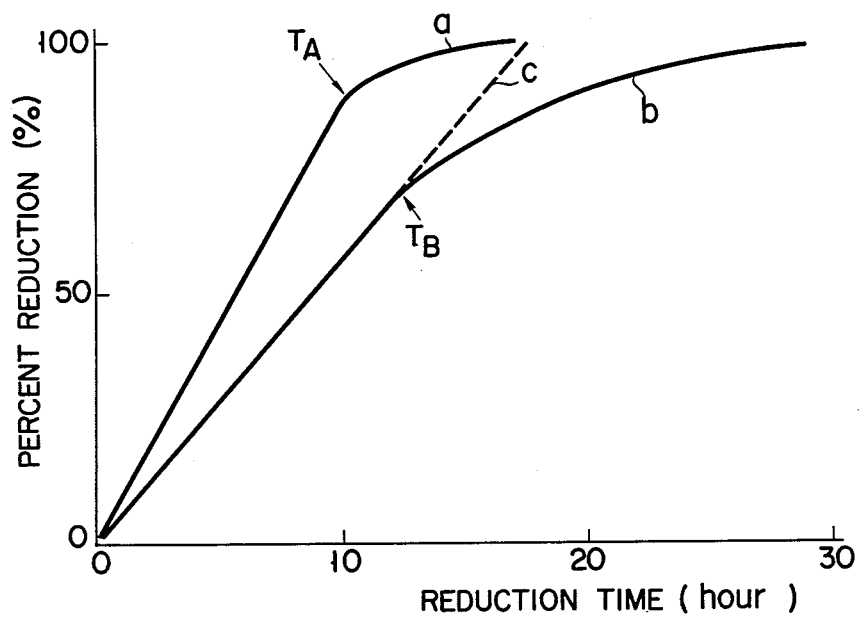
FIG. 2 is a graph showing the efficiency of reduction of gallium phosphate by two different methods.

According to the conventional reducing method as described above, the reduction of the gallium phosphate is a time-consuming procedure particularly when the flow rate of the hydrogen gas is small. The present inventors conducted the following experiments in order to determine the cause of this phenomenon. Gallium phosphate in the amount of 1 kg was placed on a semicylindrical boat of 500 mm length in a reaction tube of 80 mm inner diameter, and reduction was performed at 900° C. The ratio of the flow rate of the hydrogen gas through the main supply tube 4 to the flow rate of the hydrogen gas through the auxiliary tube 5 was set to be 4:1. Reduction was performed when the total flow rate of the hydrogen gas was 3,000 l/h and 1,500 l/h for the purpose of comparison. The relationship between the percent reduction and reduction time was examined. The results are shown in FIG. 2. The percent reduction here was calculated in the weight ratio in percent of the raw material gallium phosphate to gallium phosphide. In FIG. 2, curve a represents the case wherein the total flow rate of the hydrogen gas was 3,000 l/h and curve b represents the case wherein the total flow rate of the hydrogen gas was 1,500 l/h.

In both cases, the reduction first progressed linearly. However, the reduction then started to taper off and form a saturated curve. As the reduction progressed, the reaction products were bound and formed secondary particles. The reaction products obtained during the initial period of the reaction were weakly bound together and were easy to separate by sieving through a sieve of predetermined mesh. However, the secondary particles grew larger and were strongly bound. The reaction products after turning points TA and TB did not easily pass through the sieve of predetermined mesh.

The reason why these turning points appear on the curves during the course of the reduction may be considered to be attributable to a change in the rate-limiting mechanism of the reduction. However, the details are not yet clear. The region before the turning point during the course of reduction will be referred to as the surface layer reduction region, and the region after the turning point will be referred to as the inner layer reduction region. As is apparent from FIG. 2, when the flow rate of the hydrogen gas is reduced from 3,000 l/h to 1,500 l/h, the surface layer reducing rate becomes less, and the reaction progresses into the inner layer reduction region wherein the reaction progresses more slowly before the reduction is terminated.

Various attempts were made by the present inventors to eliminate the turning points TA and TB shown in FIG. 2 and make the reduction progress only in the surface layer reduction region where the reducing speed is fast. As a result, it was found that the surface layer reduction region may be extended by re-reducing the unreacted products which are taken out of the furnace during the course of the reduction process and from which the secondary particles are separated after agitated, and the re-reduction may also be started in the surface layer reduction region with the reaction products which are obtained from the inner layer reduction region by taking a similar measure. For example, in the method represented by curve b, the reaction products were taken out of the furnace about 12 hours after the initiation of the reduction process, that is, at the turning point TB. The reaction products were then sieved through a sieve of about 100 μm mesh for agitation. The re-reduction was then performed under the same condition as the first reduction. The re-reduction progressed linearly as represented by curve c in FIG. 2. The reduction was completed after about 5 hours. The reduction time may thus be significantly reduced by agitating the reaction products at least once during the hydrogen reduction. When to perform the agitation may be determined by simple preliminary experiments according to the intended reduction conditions. The reduction conditions may be varied before and after the agitation.

Irrespective of the reduction method adopted, the reduction is terminated and the reaction products are taken from the furnace when the residual amount of the phosphate radicals in the gallium phosphide powder is within the range of 0.03 to 0.5% by weight. In this manner, the starting raw material of the present invention is prepared. The form of the residual phosphate radicals in the reduced GaP is not clear. However, it was impossible to manufacture GaP single crystals of satisfactory quality from the starting raw material which was a mixture of pure GaP and phosphoric acid or gallium phosphate in a mixing ratio such that the content of $PO_4$ may be 0.03 to 0.5% by weight. As mentioned previously the amount of the residual phosphate radicals can be measured by the molybdenum blue absorptiometry.

When the amount of the residual phosphate radicals in the GaP powder is below 0.03% by weight, the effects of the present invention may not be obtained and the GaP powder becomes attached to the inner wall of the crucible during the melting process. On the other hand, when the amount of the phosphate radicals exceeds 0.5% by weight, the radicals are present at the interface of the encapsulating agent liquid and the GaP liquid, frequently resulting in the formation of polycrystalline GaP. The preferable amount of the residual phosphate radicals is 0.05 to 0.1% by weight.

The starting raw material thus prepared is compressed to prepare a green compact to increase the bulk density. The bulk density of the green compact is generally about 2.0 g/cc or more and is, in most cases, about 2.0 to 3.0 g/cc. If the bulk density is below 2.0 g/cc, when the encapsulating agent is placed on the green compact and is melted, the encapsulating agent liquid permeates into the green compact, and the GaP powder and the encapsulating agent cannot be separated from each other. The green compact may be obtained by a known method such as the isotropic rubber press method.

Figure 3:
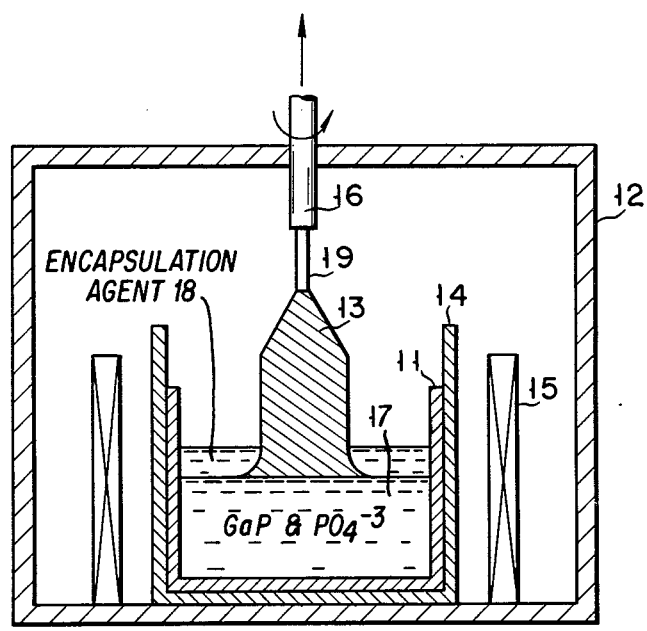
FIG. 3 is a sectional view of an apparatus for manufacturing GaP single crystals according to the method of the present invention.

In order to manufacture the GaP single crystal from the starting raw material thus prepared, the single crystal is grown by an apparatus as shown in FIG. 3 according to the conventional method and conditions. The apparatus shown in FIG. 3 has a pressure-resistant vessel 12 in which is arranged a crucible 11 is held in a susceptor 14. A heater 15 surrounds the susceptor 14. A pulling shaft 16 extends through the upper wall of the pressure-resistant vessel 12, and a seed crystal 19 is attached to the tip of the pulling shaft 16.

The starting raw material, formed into a green compact, is placed in the crucible 11 and an inert transparent glass of low vapor pressure such as $B_2O_3$ is placed thereover as an encapsulating agent. The interior of the pressure-resistant vessel 12 is pressurized by an inert gas such as nitrogen gas. When the crucible is heated by the heater 15, the encapsulating agent having a lower melting point, melts first and is converted to a transparent encapsulating agent liquid 18 to cover the green compact of GaP raw material. Heating is further performed to melt the GaP raw material to provide a GaP liquid 17. The encapsulating agent liquid 18 and the GaP liquid 17 are separated into two separate layers due to the difference in their specific gravities; the encapsulating agent liquid 18 covers the GaP liquid 17. Thereafter, the seed crystal 19 is brought into contact with the GaP liquid 17 through the encapsulating agent liquid 17. While keeping good contact between the seed crystal 19 and the GaP liquid 17, the pulling shaft 16 is rotated while being slowly pulled up. Then, the GaP liquid 17 is solidified to grow a GaP single crystal 13.

This inventional will be more fully understood from the following example.

EXAMPLE

Hydrogen reduction of gallium phosphate was performed using the apparatus as shown in FIG. 1. Gallium phosphate in the amount of 1 kg was placed in a semicylindrical boat of 500 mm length which was, in turn, placed in a cylindrical reaction tube of 80 mm inner diameter to perform the reduction at a temperature of 900° C. The ratio of the flow rate of the hydrogen gas through the main supply tube 4 to that of the hydrogen gas through the auxiliary supply tube 5 was set to be 4:1, and the total flow rate was 1,500 l/h. After the primary reduction which required about 12 hours, the reaction products were taken out of the furnace. The reaction products were soft powders consisting of particles having a particle size of several hundred microns. Each consisted of smaller particles having a particle size of several microns which were weakly bound together. The chemical analysis of these particles revealed a percent reduction of about 70%. When these particles were passed through a sieve of about 100 $\mu$m mesh, they were easily separated and all of them were passed. The sieved reaction products were returned to the furnace and the secondary reduction step was performed under the same conditions for the primary reduction step. During the secondary reduction step, samples were taken to determine the amount of the residual phosphate radicals by the molybdenum blue absorptiometric method. When the content of the residual phosphate radicals was determined to be 0.1% by weight, the reduction was terminated and the reaction product (GaP powder) was taken out of the apparatus. The bulk density of the obtained GaP powder was about 1.1 g/cc. When this GaP powder was isotropically pressed at a pressure of about 2,000 kg/cm$^2$, the bulk density of the pressed polycrystalline raw material was 2.2 g/cc. This polycrystalline starting material was placed in the crucible. The bulk density after filling was also about 2.2 g/cc. Subsequently, $B_2O_3$ was placed over the polycrystalline starting raw material, and melting was performed according to the predetermined method in a high-pressure vessel. The $B_2O_3$ which has the lower melting point melted first. It was then confirmed that the $B_2O_3$ liquid layer covered the GaP powder layer in separate layers. When the temperature was raised until the GaP powder was melted, the GaP powder layer melted down and the GaP liquid layer was covered by the $B_2O_3$ liquid layer in separate layers. During this melting process, the attachment of the GaP powder to the wall surface of the crucible was not observed which is common when the conventional GaP powder is used. The surfaces of the $B_2O_3$ liquid layer and he GaP liquid layer were clean. The seed crystal was brought into contact with the GaP liquid layer through the $B_2O_3$ liquid layer according to the predetermined method to complete the pulling of a single crystal. As a result, a complete single crystal was obtained which did not contain subgrains.

As may be seen from the above example, an inexpensive GaP single crystal may be manufactured in a simple manner and with good yield, providing a method which is industrially advantageous.

What we claim is:

1. A method for manufacturing gallium phosphide single crystals comprising the steps of:
    compressing a polycrystalline gallium phosphide powder into a green compact, said green compact having a bulk density of not less than 2.0 g/cc, the polycrystalline gallium phosphide powder being prepared by hydrogen reduction of gallium phosphate and containing residual phosphate radicals in an amount of 0.03 to 0.5% by weight;
    placing the green compact in a crucible and placing an encapsulating agent thereover;
    heating the green compact in a crucible and the encapsulating agent placed in the crucible to provide a gallium phosphide liquid and an encapsulating agent liquid covering thereover; and bringing a seed crystal into contact with the gallium phosphide liquid and pulling the seed crystal.

2. A method according to claim 1, wherein the hydrogen reduction is performed in at least two stages, and a reaction product is agitated after each stage.

3. A method according to claim 1, wherein the green compact has a bulk density of about 2.0 to 3.0 g/cc.

4. A method according to claim 1, wherein the gallium phosphide powder contains the residual phosphate radicals in an amount of 0.05 to 0.1% by weight.

5. A method according to claim 1, wherein the encapsulating agent is boron oxide.

6. A method according to claim 1, wherein the seed crystal is pulled while being rotated.

* * * * *